United States Patent [19]
Yoshida et al.

[11] Patent Number: 6,111,305
[45] Date of Patent: Aug. 29, 2000

[54] P-I-N SEMICONDUCTOR PHOTODETECTOR

[75] Inventors: Takeshi Yoshida; Yusuke Otomo, both of Tokyo, Japan

[73] Assignee: Nippon Telegraph and Telephone Corporation, Tokyo, Japan

[21] Appl. No.: 09/168,653

[22] Filed: Oct. 8, 1998

[30] Foreign Application Priority Data

Oct. 9, 1997 [JP] Japan .................................. 9-293435

[51] Int. Cl.$^7$ ...................... H01L 31/075; H01L 31/105; H01L 31/117
[52] U.S. Cl. ........................................... 257/656; 257/458
[58] Field of Search .................... 257/458, 656, 257/402

[56] References Cited

U.S. PATENT DOCUMENTS

| | | | |
|---|---|---|---|
| 5,519,247 | 5/1996 | Arbus et al. | 257/437 |
| 5,538,564 | 7/1996 | Kaschmitter | 136/255 |

FOREIGN PATENT DOCUMENTS 405136436  6/1993  Japan ..................................... 257/656

OTHER PUBLICATIONS

"p–i–n Photodiodes Made in Laser–Recrystallized Silicon–on–Insulator", IEEE Transactions on Electron Devices, vol. ED–33, No. 2, Feb. 1986, pp. 203–205, Jean–Pierre Colinge.

"A VLSI–Compatible High–Speed Silicon Photodetector for Optical Data Link Applications", IEEE Transactions on Electron Devices, vol. 43, No. 7, Jul. 1996, pp. 1054–1060, Ghioni et al.

"TA 6.1:A3.3–V Monolithic Photodetector/CMOS Preamplifier for 531 Mb/s Optical Data Link Applications", ISSCC93/Session 6/Broadband Data Communications/Paper TA 6.1, 1993 IEEE International Solid–State Circuits Conference, Peter J–W Lim et al., pp. 96–97.

*Primary Examiner*—David Hardy
*Assistant Examiner*—Jhihan B Clark
*Attorney, Agent, or Firm*—Fitch, Even, Tabin & Flannery

[57] ABSTRACT

A semiconductor photodetector includes a SOI substrate; a p-i-n photodiode provided on the SOI substrate, the p-i-n photodiode having an i-type semiconductor region; an insulator film provided on the i-type semiconductor region; and a depleting electrode provided on the insulator film. The semiconductor photodetector exhibits its function well with or without a power source for applying a voltage to the depleting electrode for depleting it. When the power source for depletion is used, the function of the device is realized at a voltage for depletion applied from the power source for depletion lower than a biasing voltage applied from a biasing power source.

8 Claims, 13 Drawing Sheets

P-I-N SEMICONDUCTOR PHOTODETECTOR

This application is based on Patent Application No. 9-293435 filed Oct. 9, 1997 in Japan, the content of which is incorporated hereinto by reference.

BACKGROUND OF THE INVENTION

1. Field of the Invention

The present invention relates to a pin-type semiconductor photodetector and more particularly to a p-i-n semiconductor photodetector which can be used in short-wavelength (780 to 850 nm) LAN systems.

2. Description of Related Art

There have been proposed a pin-type semiconductor photodetector which will be described below referring to FIGS. 1 and 2.

In the conventional p-i-n semiconductor photodetector, on a main surface 1a of a single crystal semiconductor substrate 1 made of a p-type single crystal is arranged a single crystal semiconductor layer 3 made of a single crystal and 50 to 400 nm thick through an insulator film 2. In practice, this structure is fabricated by implantation of oxygen ions. For example, oxygen ions are implanted into a single crystal semiconductor substrate which is contemplated to constitute the single crystal semiconductor substrate 1 such that an insulator film 2 is formed so as to leave undoped single crystal semiconductor substrate 1 and single crystal semiconductor layer 3 lying thereunder and thereover, respectively. Hence, it should be noted that the insulator film 2 inevitably has a relatively large thickness as large as 110 nm.

Also, there are formed in the single crystal semiconductor layer 3 a p-type semiconductor region 4, an i-type semiconductor region 5, and an n-type semiconductor region 6, which extend between a main surface 3a of the single crystal semiconductor layer 3 on a side opposite to the insulator film 2 and a main surface 3b opposing to the main surface 3a such that the semiconductor regions 4, 5 and 6 are arranged in a pattern of stripes of 2 µm, 3 µm, and 2 µm, respectively, wide in a sequence in which the i-type semiconductor region 5 is present between the p-type semiconductor region 4 and n-type semiconductor region 6 as seen both from the main surface 3a and from the main surface 3b of the single crystal semiconductor layer 3.

Further, on the main surface 3a of the single crystal semiconductor layer 3a are attached biasing electrodes 7 and 8 in ohmic contact to the p-type and n-type semiconductor regions 4 and 6, respectively. In addition, on a main surface 1b of the single crystal semiconductor substrate 1 which is opposite to the main surface 1a on which the insulator film 2 is formed, there is provided an electrode 9 as a depleting electrode.

In the conventional p-i-n semiconductor photodetector of the above-described construction, connecting an anode of the biasing power source 11 to the biasing electrode 8 attached to the n-type semiconductor region 6, the biasing electrode 7 attached to the p-type semiconductor region 4 to the ground through the load 12, and a cathode of the depleting power source 13, whose anode is grounded, to the depletion electrode 9, results in the formation of a depleted layer which extends from the side of the single crystal semiconductor substrate 1 to the side of the i-type semiconductor region 5 of the single crystal semiconductor layer 3 with a dimension depending on the value of a voltage for depletion obtained from the depleting power source 13. This occurs because the cathode side of the depleting power source 13 is connected to the depleting electrode 9 between the depleting electrode 9 and the ground. For this reason, use of a power source, as the depleting power source 13, which can provide a voltage sufficient to deplete all over the i-type semiconductor region 5 will allow depletion of the i-type semiconductor region 5 entirely.

If the i-type semiconductor region 5 is fully depleted as described above, there is formed in the depleted i-type semiconductor region 5 a drift electric field which drifts the carriers therein in the direction bridging the p-type semiconductor region 4 and n-type semiconductor region 6.

Since the biasing power source 11 is connected to the biasing electrodes 7 and 8 through the load 12, even if the i-type semiconductor region 5 is depleted due to the biasing voltage obtained from the biasing power source 11, the depletion does not distribute all over the i-type semiconductor region 5 for various practical reasons, for example, (1) it is impossible to elevate the biasing voltage to be obtained from the biasing power source 11 to a value higher than the voltage of 2 to 3.3 V currently obtained from the power source for driving the semiconductor integrated circuits described below; (2) in practice, the power source for driving a semiconductor integrated circuit is used as the biasing power source 11 since it is advantageous to use a driving power source providing a relatively low voltage as low as 2 to 3.3V as used in semiconductor integrated circuits when it is contemplated to construct a semiconductor integrated circuit comprising a p-i-n semiconductor photodetector and an insulated gate transistor, in which an optical detected output from the currently explained p-i-n semiconductor in a manner as described below is input to the insulated gate transistor; and (3) the i-type semiconductor region 5 in fact contains a relatively high concentration of a p-type or n-type dopant.

Also, according to the conventional p-i-n semiconductor photodetector as shown in FIGS. 1 and 2, in a state that the i-type semiconductor region 5 is depleted all over the region and a drift electric field is generated in the i-type semiconductor region 5, inputting a light from the main surface 3a to the single crystal semiconductor layer 3 generates in the single crystal semiconductor layer 3 carriers, i.e., electrons or holes, within the depleted i-type semiconductor region 5, and the electrons or holes are allowed to drift toward the p-type semiconductor region 4 or n-type semiconductor region 6, respectively, due to the drift electric field. This causes photocurrent to flow in the load 12 depending on the input light so that a voltage depending on the input light appears as an optical detected output from the both ends of the load 12 in a high response speed. Thus, a function of p-i-n semiconductor photodetector can be obtained.

SUMMARY OF THE INVENTION

In the case of the conventional p-i-n semiconductor photodetector as shown in FIGS. 1 and 2, the depleting power source 13 is required for providing a depleting voltage between the depleting electrode 9 and the ground in order to deplete the i-type semiconductor region 5 all over the region 5 so that a function of p-i-n semiconductor photodetector can be obtained. Also, the insulator film 2 provided between the single crystal semiconductor substrate 1 and the i-type semiconductor region 5, i.e., between the substrate 1 and the single crystal semiconductor layer 3, is in practice fabricated in the above-described manner it is inevitable that the insulator film 2 has to be of a relatively large thickness as thick as 110 nm, for example. Further, if the single crystal semiconductor substrate 1 is in common with a substrate on which the above-described semiconductor integrated circuit is fabricated, then the substrate of the semiconductor integrated circuit must have a low impurity concentration since it is desirable that its impurity concentration is as low as possible, so that a power source that can provide a high depleting voltage as high as 10 V is required as the depleting power source 13 because of the substrate 1 having a low impurity concentration.

Accordingly, an object of the present invention is to provide a novel p-i-n semiconductor photodetector free of the above-described disadvantages.

Accordingly, the present invention provides a semiconductor photodetector comprising: a SOI (Silicon on Insulator) substrate; a p-i-n photodiode provided on the SOI substrate, the p-i-n photodiode having an i-type semiconductor region; an insulator film provided on the i-type semiconductor region; and a depleting electrode provided on the insulator film.

Here, the i-type semiconductor region may have a thickness not greater than a width of a depletion layer depending on a concentration of an impurity in the i-type semiconductor region, and the depleting electrode may have an voltage fixed to that of ground or a supply voltage from a power source for depletion.

The semiconductor photodetector may further comprise a depleting power source connected to the depleting electrode for depleting the i-type semiconductor region.

The depleting electrode may be arranged in a pattern of stripes.

The depleting electrode may be arranged in a pattern of concentric annuli.

The depleting electrode may be arranged in a pattern of antennae.

The semiconductor photodetector may further comprise a reflecting film which confines inside of the photodetector a light input from outside into the single crystal semiconductor layer.

The present invention also provides a p-i-n semiconductor photodetector comprising a substrate; an insulator film provided on the substrate; a single crystal semiconductor layer having main surfaces opposite to each other, comprising a p-type semiconductor region, an i-type semiconductor region, and a n-type semiconductor region, arranged in a pattern such that as seen from a side of either one of the main surfaces of the single crystal semiconductor layer, the i-type semiconductor region is arranged between the p-type semiconductor region and the n-type semiconductor region; biasing electrodes provided on the p-type semiconductor region and the n-type semiconductor region, respectively, in ohmic contact thereto for biasing them; an insulator film provided on the i-type semiconductor region; and a depleting electrode for depleting the i-type semiconductor region; wherein the depleting electrode has a voltage fixed to that of ground or a supply voltage from a power source for depletion.

The p-i-n semiconductor photodetector may further comprise a power source connected to the depleting electrode for applying a voltage to deplete the i-type semiconductor region.

In another aspect, the present invention provides a semiconductor photodetector circuit comprising: a semiconductor photodetector comprising a SOI substrate, a p-i-n photodiode provided on the SOI substrate, the p-i-n photodiode having an i-type semiconductor region; an insulator film provided on the i-type semiconductor region; and a depleting electrode provided on the insulator film; and an amplifier circuit and optionally an integrated circuit, monolithically integrated on the SOI substrate.

According to the present invention, a p-type semiconductor region, an i-type semiconductor region, and an n-type semiconductor region are formed on a SIMOX (Separation by Implanted OXygen) substrate and over the i-type semiconductor region is provided a polysilicon (poly-Si) gate electrode through a gate oxide film to construct a p-i-n photodiode. A reverse voltage is applied between the n-type semiconductor region and p-type semiconductor region. A biasing voltage is applied to the poly-Si gate electrode in order to deplete the i-type semiconductor region.

The p-i-n photodiode is fully depleted by the poly-Si electrode so that leak current can be minimized. Further, the width of respective semiconductor regions can be set up freely, which results in realization of an increase in responsivity and a decrease in parasitic capacitance.

The p-i-n semiconductor photodetector of the present invention functions well without using any depleting power source or only using a power source which provides a depleting voltage lower than that obtained from the biasing power source.

The above and the other objects, effects, features and advantages of the present invention will become more apparent from the following description of embodiments thereof taken in conjunction with the accompanying drawings.

DESCRIPTION OF PREFERRED EMBODIMENTS

Figure 1:
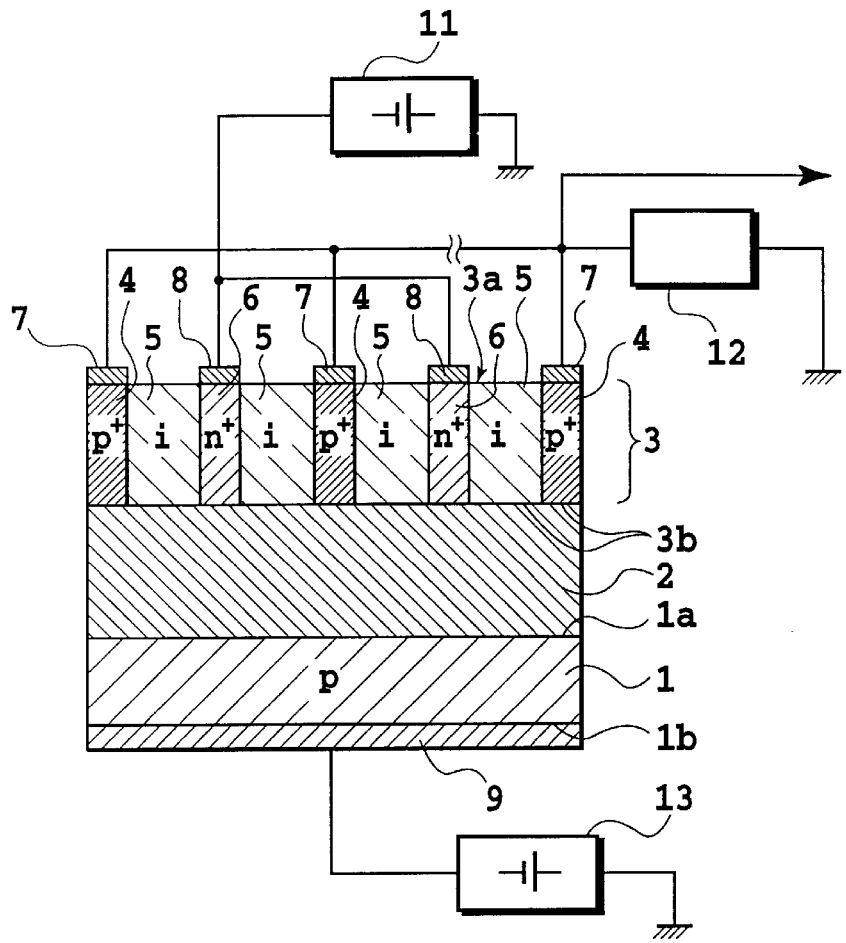
FIG. 1 is a schematic cross-sectional view showing a conventional p-i-n semiconductor photodetector.
Figure 2:
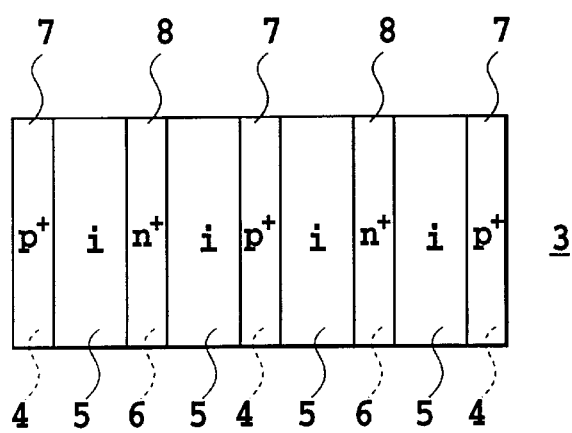
FIG. 2 is a schematic plan view showing a conventional p-i-n semiconductor photodetector.

The p-i-n semiconductor photodetector of the present invention, like the conventional one shown in FIGS. 1 and 2, has the construction that (1) a single crystal semiconductor layer is arranged on a substrate through an insulator film, (2) a p-type semiconductor region, an i-type semiconductor region, and an n-type semiconductor region are provided so as to extend between opposing main surfaces of the single crystal semiconductor layer in a pattern where the i-type semiconductor region is arranged between the p-type and n-type semiconductor regions as seen from both main surfaces of the single crystal semiconductor layer, and (3) respective biasing electrodes are attached in ohmic contact to the p-type and n-type semiconductor regions.

However, the p-i-n semiconductor photodetector of the present invention is characterized in that (4) it includes besides the above-described construction a depleting electrode for depleting the i-type semiconductor region on the single crystal semiconductor layer through a relatively thin insulator film such that a depletion layer extends across the i-type semiconductor region from the side it contacts the insulator film.

In the p-i-n semiconductor photodetector of the present invention, the i-type semiconductor region has a thickness not greater than a width of a depletion layer depending on the concentration of an impurity in the i-type semiconductor region. More specifically, in the construction of the p-i-n semiconductor photodetector of the present invention, that includes a heavily-doped polysilicon electrode on the i-type semiconductor region, the thickness of the i-type semiconductor region is not greater than a width of the depletion layer which depends on the impurity concentration of the i-type semiconductor region. That is, the width of the depletion layer formed depends on the concentration of an impurity in the i-type semiconductor region as described below referring to FIG. 6. For example, if the i-type semiconductor region has an impurity concentration within the ranges of $10^{15}$ to $10^{18}$, then the width of the depletion layer ranges from about 25 to about 900 nm.

The pattern of the p-i-n junctions in the semiconductor photodetector of the present invention may be in the form of concentric annuli, stripes or antennae. By "annuli" is meant closed band-like regions or structures (e.g., rings), which are not limited to circular shapes but also include rectangular shapes.

EMBODIMENTS

The present invention will be described in greater detail by embodiments but not limited thereto.

Embodiment 1

Figure 3:
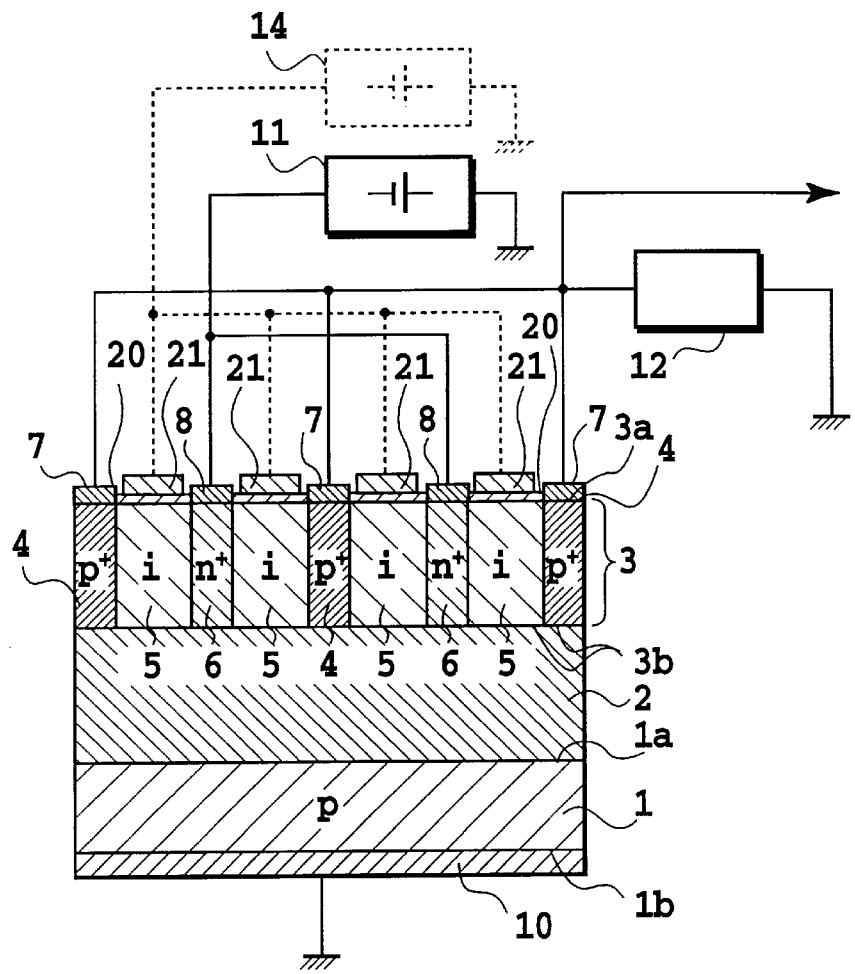
FIG. 3 is a schematic cross-sectional view showing a p-i-n semiconductor photodetector according to a first embodiment of the present invention.
Figure 4:
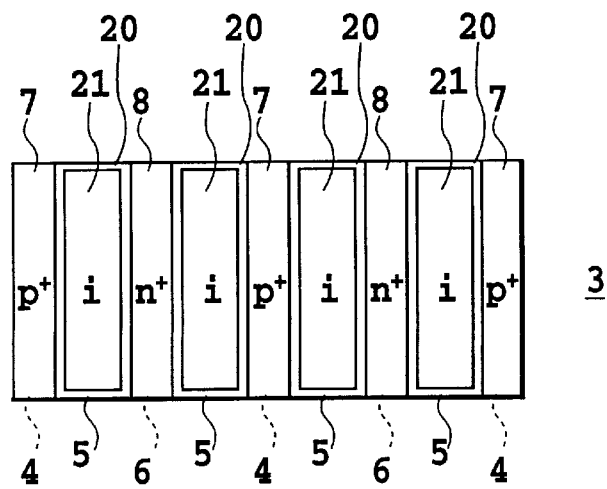
FIG. 4 is a schematic plan view showing a p-i-n semiconductor photodetector according to a first embodiment of the present invention.

Referring to FIGS. 3 and 4, description will be made of a first embodiment of p-i-n semiconductor photodetector of the present invention.

In FIGS. 3 and 4, the same or similar members as shown in FIGS. 1 and 2 are indicated by the same reference numerals.

The p-i-n semiconductor photodetector of the present invention as shown in FIGS. 3 and 4, like the conventional one as shown in FIGS. 1 and 2, includes a single crystal semiconductor substrate 1 made of single crystal silicon and have p-type conductivity and a single crystal semiconductor layer 3 which is made of single crystal silicon and has a thickness of, for example, 50 to 400 nm over a main surface 1a of the substrate 1 through an insulator film made of silicon dioxide ($SiO_2$). In this case too, the single crystal semiconductor substrate 1, the insulator film 2, and the single crystal semiconductor layer 3 are formed in the same manner as the conventional p-i-n semiconductor photodetector and, hence, the insulator film 2 must remain to have a relatively large thickness of, e.g., 110 nm.

Further, in the p-i-n semiconductor photodetector of the present invention, three types of semiconductor regions are formed in the single crystal semiconductor layer 3, that is, a p-type semiconductor region 4, an i-type semiconductor region 5, and an n-type semiconductor region 6. These semiconductor regions extend between a main surface 3a of the single crystal semiconductor layer 3 on a side opposite to the insulator film 2 and a main surface 3b opposing to the main surface 3a and the regions 4, 5 and 6 are arranged in a pattern of stripes of 2 μm, 3 μm, and 2 μm, respectively, wide in a sequence in which the i-type semiconductor region 5 is present between the p-type semiconductor region 4 and n-type semiconductor region 6 as seen both from the main surface 3a and from the main surface 3b of the single semiconductor layer 3.

Further, on the main surface 3a of the semiconductor layer 3 are attached biasing electrodes 7 and 8 in ohmic contact to the p-type and n-type semiconductor regions 4 and 6, respectively.

On a main surface of 1b of the single crystal semiconductor substrate 1 opposite to the main surface 1a on which the insulator film 2 is formed, there is formed an electrode 9 as an electrode in the same manner as in the conventional p-i-n semiconductor photodetector as shown in FIGS. 1 and 2. However, in the present invention, the electrode 10 attached in ohmic contact to the substrate 1 is not for depletion of the i-type semiconductor region but it serves as an electrode to be grounded.

Next, on the side of the main surface 3a of the semiconductor layer 3 opposite to the side of the insulator film 2, there is provided on the i-semiconductor region 5 an insulator film 20 for depletion, which film is made of silicon dioxide ($SiO_2$) and sufficiently thin as thin as, e.g., 5 nm thick, and an electrode 21 provided on the insulator film 20 for depleting the i-semiconductor region 5. The depleting electrode 21 is made of polysilicon having doped an n-type impurity or dopant in high concentrations to impart conductivity to it. In the case where the p-i-n semiconductor photodetector constitutes a part of a semiconductor integrated circuit which also includes an insulated gate transistor that receives a detected optical output from the photodetector as described above, the insulator film 20 for depletion can be formed simultaneously with a gate insulator of an insulated gate transistor so that the thickness of the insulator film 20 can be made sufficiently thin, e.g., as thin as 5 nm. Also, the depleting electrode 21 can be formed simultaneously with the gate electrode of the insulated gate transistor in the above-described semiconductor integrated circuit.

In the above-described construction, a depletion layer is formed, which is attributable to the structure that the depleting electrode 21 is arranged on the main surface 3a of the single crystal semiconductor layer 3 in the i-type semiconductor region 5 through the insulator film 20 for depletion and to the existence of a work function between the depleting electrode 21 and the i-type semiconductor region 5. The depletion layer distributes in the i-type semiconductor region 5 extending from the side of the insulator film 20 or depletion.

Figure 5:
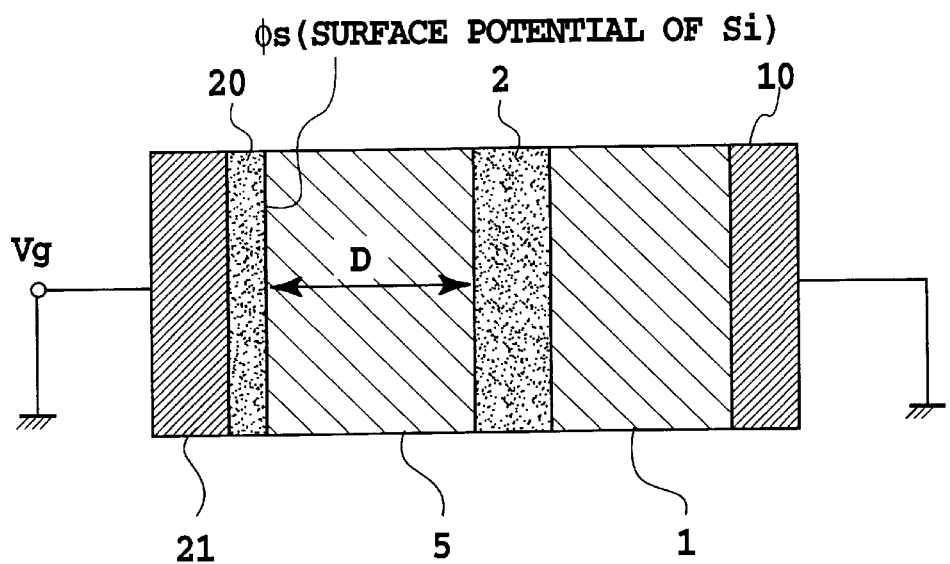
FIG. 5 is a schematic cross-sectional view showing an i-type semiconductor region-containing part of the p-i-n semiconductor photodetector shown in FIG. 1.
Figure 6:
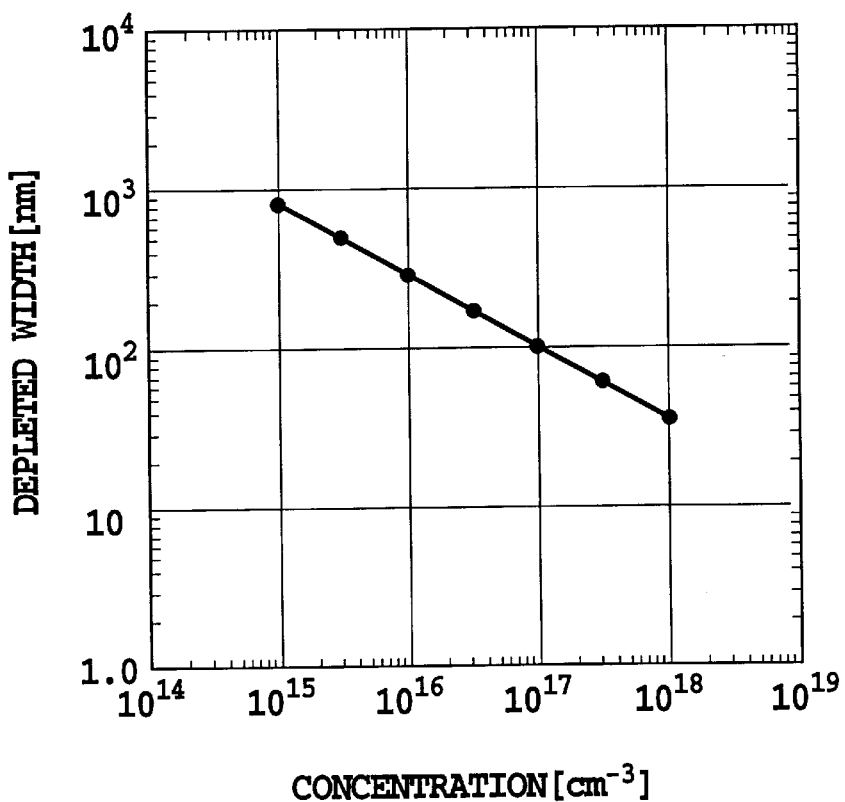
FIG. 6 is a graph illustrating a relationship between an impurity concentration and a width of depletion layer in the i-type semiconductor region in the partial structure shown in FIG. 5.

Referring to FIGS. 5 and 6, explanation will be made of the depth of the depletion layer. FIG. 5 is a schematic cross-sectional view showing a part of the lateral p-i-n semiconductor photodetector shown in FIG. 3 including an i-type semiconductor region 5 along a plane perpendicular to a main surface of the substrate. FIG. 6 is a graph illustrating a relationship between an impurity concentration and a width of depletion layer in the i-type semiconductor region 5 in the partial structure shown in FIG. 5. The extent of the depletion layer depends on various parameters, for example, the materials of the i-type semiconductor region 5 (hence, single crystal semiconductor layer 3) and of depleting electrode 21, the impurity concentration of the i-type semiconductor region 5, the thickness (e.g., 1 μm thick) of the i-type semiconductor region 5 (and hence, the thickness of the single crystal semiconductor layer 3), and so on.

Assuming the interface between the i-type semiconductor region 5 and the insulator film 20 for depletion in the partial structure shown in FIG. 5 has a surface potential $\phi_s$, $\phi_s$ and D are given by equations (1) and (2) below:

$$\phi_s = \frac{2kT}{q} \ln \frac{N_A}{n_i} \text{ (p-type) or } \frac{2kT}{q} \ln \frac{N_D}{n_i} \text{ (n-type)} \quad (1)$$

$$D = \sqrt{\frac{2\varepsilon_{si}\varepsilon_0 \phi_s}{qN_A}} \text{ (p-type) or } \sqrt{\frac{2\varepsilon_{si}\varepsilon_0 \phi_s}{qN_D}} \text{ (n-type)} \quad (2)$$

In the above equations, various symbols have the meanings below:

D: Depth of a depletion layer;
$\phi_s$: Surface potential at a maximum depletion width;
k: Boltzman constant;
T: Absolute temperature;
q: Charge of a single electron;
$n_i$: Carrier concentration of intrinsic semiconductor (Si);
$N_A$, $N_D$: Impurity concentration of a semiconductor (Si);
$\varepsilon_{si}$: Dielectric constant of a semiconductor;
$\varepsilon_0$: Dielectric constant of vacuum.
(cf. S. M. Sze., "Physics of Semiconductor Devices," A Wiley Interscience Publication, (1981))

In this case, when selection is made of certain materials, that is, when single crystal silicon is used for the single crystal semiconductor layer 3 and the depleting electrode 21 is made of a polysilicon doped with an n-type dopant, the extent of the depletion layer from the insulator film for depletion depends on the impurity concentration of the i-type semiconductor region 5. In other words, for the depth, D, of the depletion layer in the i-type semiconductor region 5, there is observed a linear relationship between log D and log $N_A$ as shown in FIG. 6.

Accordingly, if the parameters influencing on the depth of the depletion layer from the side of the insulator film 20 for depletion, including the nature of the materials of the single crystal semiconductor layer 3 and of depleting electrode 21, the impurity concentration of the i-type semiconductor region 5, the thickness of the i-type semiconductor region 5 and so on, are selected such that the depleting electrode is made of polysilicon doped with an n-type dopant in high concentrations, the single crystal semiconductor layer 3 is made of single crystal silicon as described above, then selection, from among the various parameters, of either one or both of the impurity concentration of the i-type semiconductor region 5 and the thickness of the i-type semiconductor region 5 (and hence of the single crystal semiconductor layer 3) appropriately results in a full depletion of the i-type semiconductor region 5 over its entire length or depth without using any power source to be connected between the depleting electrode 21 and the ground.

Under the conditions where there would be no other choice than selecting the above-described parameters such that the work function between the depleting electrode 21 and the i-type semiconductor region 5 alone cannot afford a full depletion of the i-type semiconductor region 5 unless a power source for depletion is connected between the depleting electrode 21 and the ground, then connection of an depleting electrode 14 between the depleting electrode 21 and the ground as indicated in broken line in FIG. 3 will result in a full depletion of the i-type semiconductor region 5. In this case, the full depletion of the i-type semiconductor region 5 can be also achieved even at a voltage for depletion applied from the depleting power source 14 being lower than the voltage at which the above-described semiconductor integrated circuit is driven by setting the parameters appropriately.

In a state where the i-type semiconductor region 5 is fully depleted, with the biasing electrode 11 being connected to the biasing electrodes 7 and 8 on the p-type and n-type semiconductor regions 4 and 6, respectively, inputting light to the single crystal semiconductor layer 3 from the side of its main surface 3a as in the conventional p-i-n semiconductor photodetector, will generate carriers in the depleted i-type semiconductor region 5 in the single crystal semiconductor layer 3. On the other hand, there is generated a drift electric field which drifts the carries instantly generated toward the biasing electrode 7 or 8 (electrons toward the electrode 7 or p-type semiconductor region 4 and holes toward the electrode 8 or n-type semiconductor region 6). Therefore, the carriers, i.e., electrons or holes, immediately after their generation are drifted to reach the biasing electrode 7 or 8, which makes photocurrent depending on the light input to flow to the load 12 so that a detected optical output in response to the input light can be obtained from both terminals of the load 12 at a high response speed. Thus, a function of a p-i-n semiconductor photodetector can be realized.

The maximum operation frequency, f, of the p-i-n semiconductor photodetector depends on a maximum operation drift speed, $f_r$, which in turn depends on the drift speed of carriers and a maximum operation frequency, $f_c$, which depends on a RC time constant.

Figure 7:
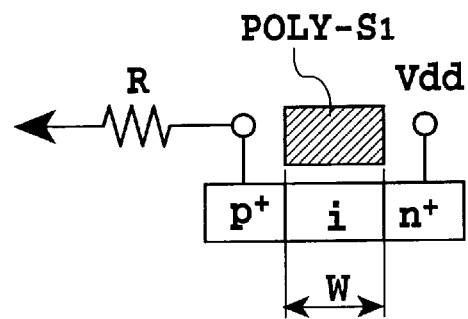
FIG. 7 is a schematic diagram showing a photodiode part of the photodetector shown in FIG. 3.

More particularly, referring to FIG. 7, which is a schematic diagram showing a photodiode part of the photodetector shown in FIG. 3, the above-described relationship is explained as follows:

Assuming that:

1) Maximum operation frequency $f_t$ depending on the drift speed of carriers is given by equation (3) below:

$$f_t = \frac{1}{2\pi t_{drift}} \quad (3)$$

where $t_{drift}$ denotes the time in which carriers pass through the i-type semiconductor region of a width of W given by equation (4) below:

$$t_{drift} = \frac{W}{\mu_p \times E} \quad (4)$$

where E (V/cm) is the intensity of an electric field in the i-type semiconductor region;

$\mu_p$ (cm$^2$/Vs) is the mobility of holes (200 (cm$^2$/Vs) for a impurity concentration of $10^{17}$).

Figure 8:
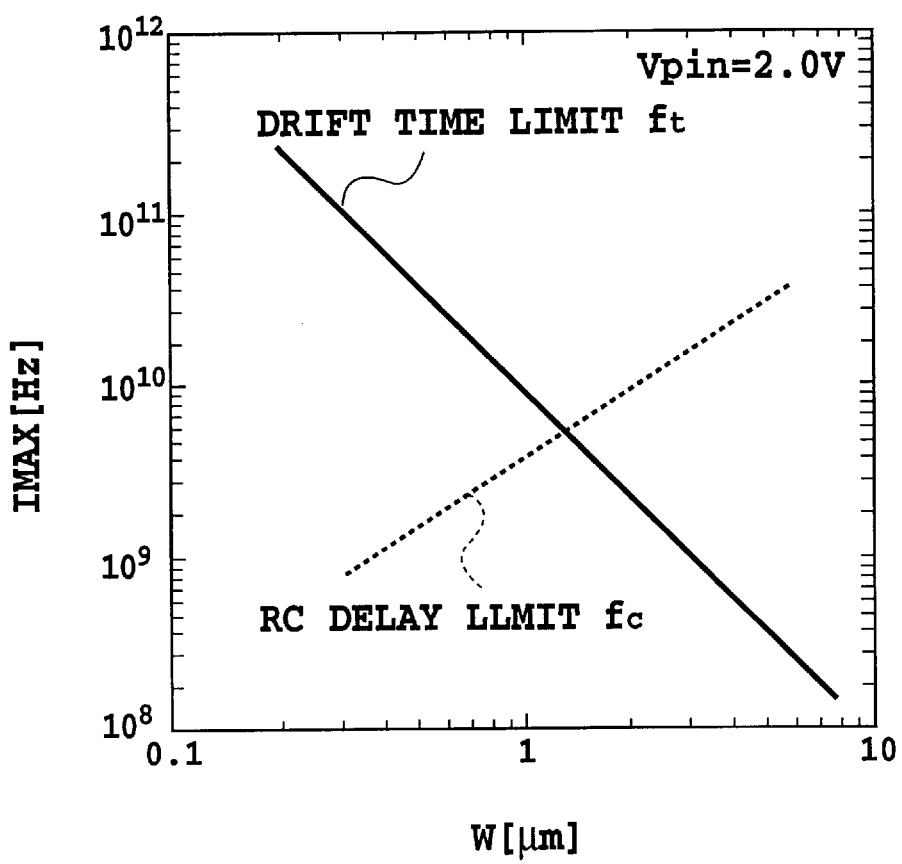
FIG. 8 is a graph illustrating a relationship between a width of depletion layer in the i-type semiconductor region and a maximum operation frequency of the photodetector shown in FIG. 3.

2) Maximum operation frequency $f_c$ depending on RC time constant is given by equation (5) below:

$$f_c = \frac{1}{2\pi RC} \quad (5)$$

where R is an input resistance of an amplifier circuit
(R=$r_f$/A$_0$
$r_f$: feedback resistance
A$_0$: an open loop gain of the amplifier circuit)
and C is a capacitance of the photodiode (e.g., R=1 kΩ/5=200Ω)
then a relationship between a width of depletion layer in the i-type semiconductor region and a maximum operation frequency of the photodetector shown in FIG. 3 is illustrated in FIG. 8 and the maximum operation frequency, f, of the p-i-n semiconductor photodetector is obtained by equation (6) below:

$$\frac{1}{f^2} = \frac{1}{f_c^2} + \frac{1}{f_t^2} \quad (6)$$

(cf. "Hikari Debaisu" (Optical Devices), Corona, Tokyo, Japan (1986)).

As will be apparent from the foregoing, with the p-i-n semiconductor photodetector in accordance with the first embodiment of the present invention as shown in FIGS. 3 and 4, the function of a p-i-n semiconductor photodetector is realized because the parameters which determine the extent of the depletion layer from the side of the insulator film 20 for depletion through the i-type semiconductor region 5 can be selected so that depletion of the i-type semiconductor region 5 distributes all over the region without application of a voltage for depletion to the depleting electrode 21. Thus the function of a p-i-n semiconductor photodetector can be obtained without the defects of the conventional one as shown in FIGS. 1 and 2.

Further, according to the present embodiment, even when the parameters governing the extent of the depletion layer from the side of the insulator film 20 for depletion through the i-type semiconductor region 5 are only selectable such that the depletion of the i-type semiconductor region 5 does not distribute all over the region without application of a voltage for depletion to the depleting electrode 21, application of a voltage for depletion to the depleting electrode 21 will result in a full depletion of the i-type semiconductor region 5, thus realizing the function of a p-i-n semiconductor photodetector without the defects of the conventional one as shown in FIGS. 1 and 2.

Embodiment 2

Figure 9:
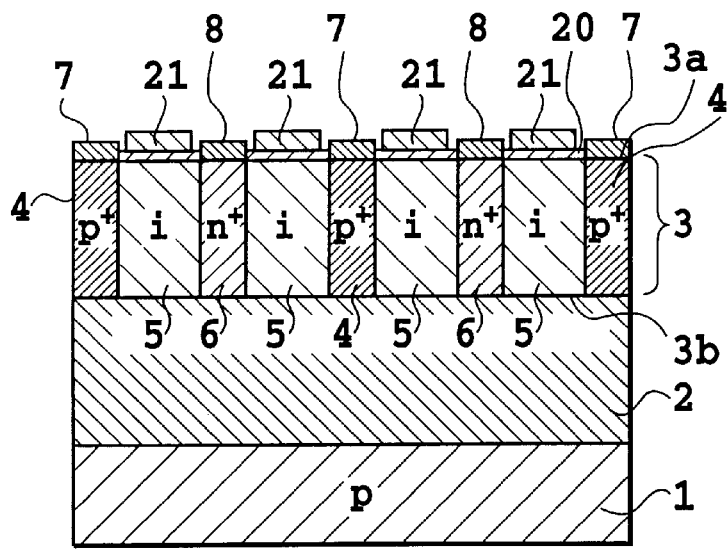
FIG. 9 is a schematic cross-sectional view showing a p-i-n semiconductor photodetector according to a second embodiment of the present invention.
Figure 10:
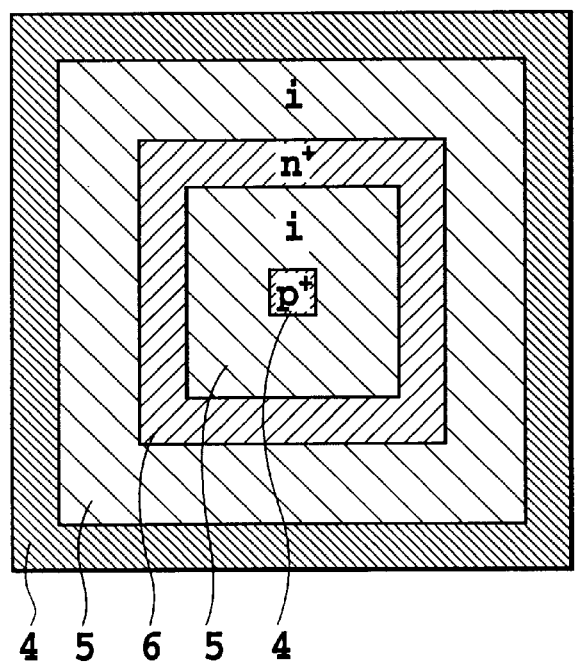
FIG. 10 is a schematic plan view showing a p-i-n semiconductor photodetector according to a first embodiment of the present invention.

Referring to FIGS. 9 and 10, the p-i-n semiconductor photodetector according to a second embodiment of the present invention will be described.

In FIGS. 9 and 10, the same or similar members as shown in FIGS. 3 and 4 are indicated by the same reference numerals and detailed description thereof will be omitted. The p-i-n semiconductor photodetector according to the present embodiment has the same construction as one described in the first embodiment of the present invention except for the structure of the single crystal semiconductor layer 3. More particularly, the p-type semiconductor region 4, the i-type semiconductor region 5, and the n-type semiconductor region 6 are arranged in such a pattern that as seen from the main surface 3a of the single crystal semiconductor layer 3, the n-type semiconductor region 6 surrounds the p-type semiconductor region 4 through the i-type semiconductor region 5 or the p-type semiconductor region 4 surrounds the n-type semiconductor region 6 through the i-type semiconductor region 5.

Since the p-i-n semiconductor photodetector according to the present embodiment has the same construction as the one described in Embodiment 1 (FIGS. 3 and 4) except for the pattern in which the three semiconductor regions with different conductivity types in the single crystal semiconductor layer 3 are arranged, it will be readily understood by one skilled in the art that the same or similar function and effects can be obtained.

Embodiment 3

Figure 11:
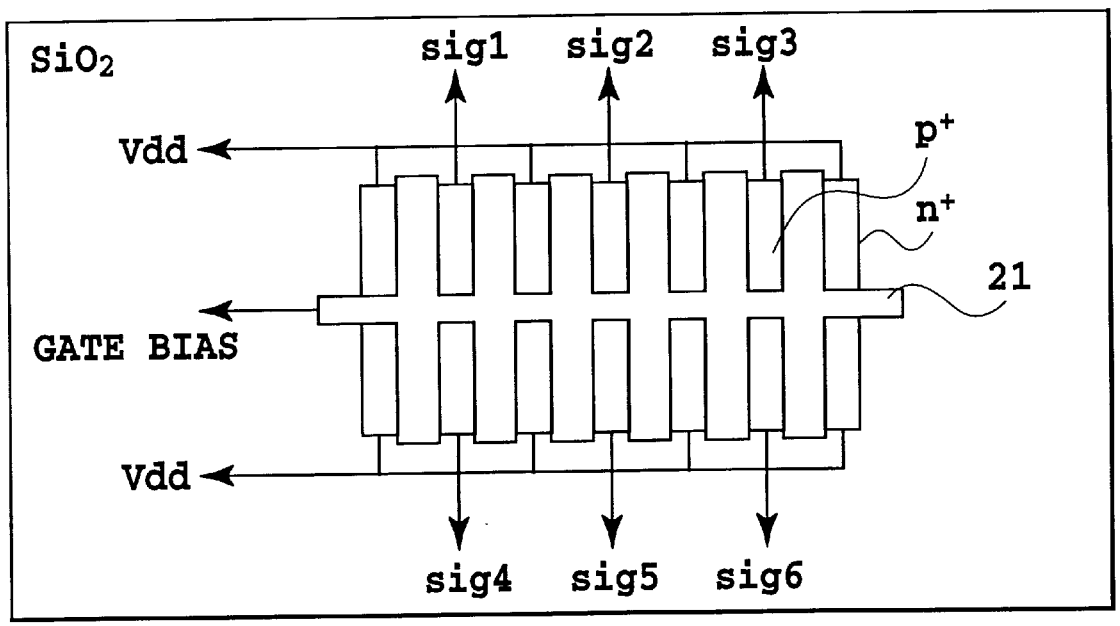
FIG. 11 is a top view showing a semiconductor photodetector in the form of an antenna according to the present invention.
Figure 12:
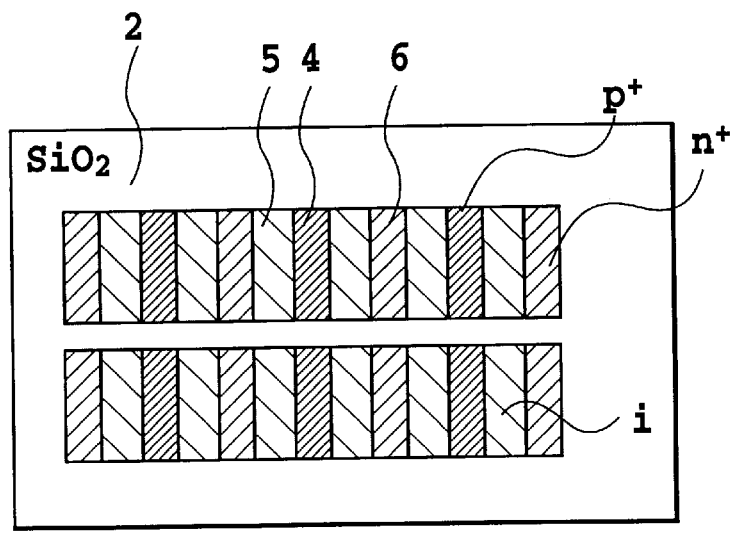
FIG. 12 is a top view showing the semiconductor photodetector shown in FIG. 11 without a depleting electrode.

Referring to FIGS. 11 and 12, the p-i-n semiconductor photodetector according to a third embodiment of the present invention will be described.

FIG. 11 is a top view showing a semiconductor photodetector in the form of an antenna according to the present embodiment and FIG. 12 is a top view showing the semiconductor photodetector shown in FIG. 11 in the absence of a depleting electrode. In FIGS. 11 and 12, the same or similar members as shown in FIGS. 3 and 4 are indicated by the same reference numerals and detailed description thereof will be omitted. The p-i-n semiconductor photodetector according to the present embodiment has the same construction as one described in the first embodiment of the present invention except that two rows of lateral p-i-n semiconductor structure are provided and a single depleting electrode 21 is provided on the i-type semiconductor regions 5 of the double lateral p-i-n structure.

This construction enables one to save the area on which photodiodes are to be fabricated, thus allowing downsizing of the semiconductor photodetector or integrated circuit including such device component.

Since the p-i-n semiconductor photodetector according to the present embodiment has the same construction as the one described in Embodiment 1 (FIGS. 3 and 4) except for the pattern in which the three semiconductor regions with different conductivity types in the single crystal semiconductor layer 3 are arranged, it will be readily understood by one skilled in the art that the same or similar function and effects can be obtained.

Embodiment 4

Figure 13:
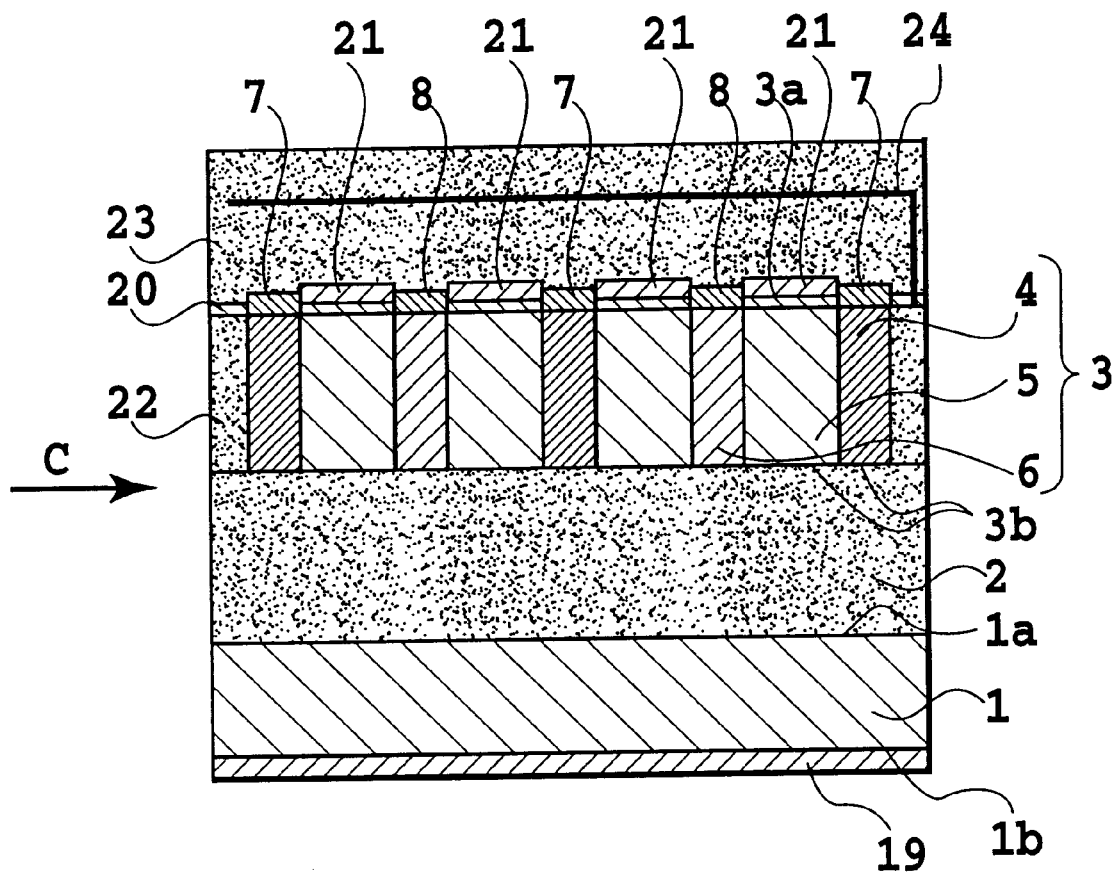
FIG. 13 is a schematic cross-sectional view showing a p-i-n semiconductor photodetector according to a third embodiment of the present invention.

Referring to FIG. 13, the p-i-n semiconductor photodetector according to a fourth embodiment of the present invention will be described.

FIG. 13 is a schematic cross-sectional view showing a p-i-n semiconductor photodetector having a reflecting film according to a fourth embodiment of the present invention.

In FIG. 13, the same or similar members as shown in FIGS. 3 and 4 are indicated by the same reference numerals and detailed description thereof will be omitted. The p-i-n semiconductor photodetector according to the present embodiment has the same construction as one described in the first embodiment of the present invention except that the former is provided with a an insulator film 22 on the side surfaces of the single crystal semiconductor layer 3 including the p-i-n structure and an insulating film 23 formed on the top surfaces of the biasing electrodes 7 and 8, the insulator film 20 for depletion, and the depleting electrode 21, as well as a reflecting film 24 of the metal wiring using LSI process embedded in the insulator film 23 in parallel to the main surface 3a of the single crystal semiconductor layer 3, with an end portion 24a being folded at right angles to the remaining part of the reflecting film so that the reflecting film 24 partially surrounds the single crystal semiconductor layer 3 from above its main surface 3a and above one of its sides opposite to the side where light is input to the single crystal semiconductor layer 3 thorough the insulator film 22. in the direction parallel to the main surface 3a of the semiconductor layer 3 as indicated by an arrow C in FIG. 13.

It will be understood that the existence of the reflecting film according to the present embodiment further improves the performance of the p-i-n semiconductor photodetector.

Embodiment 5

Figure 14:
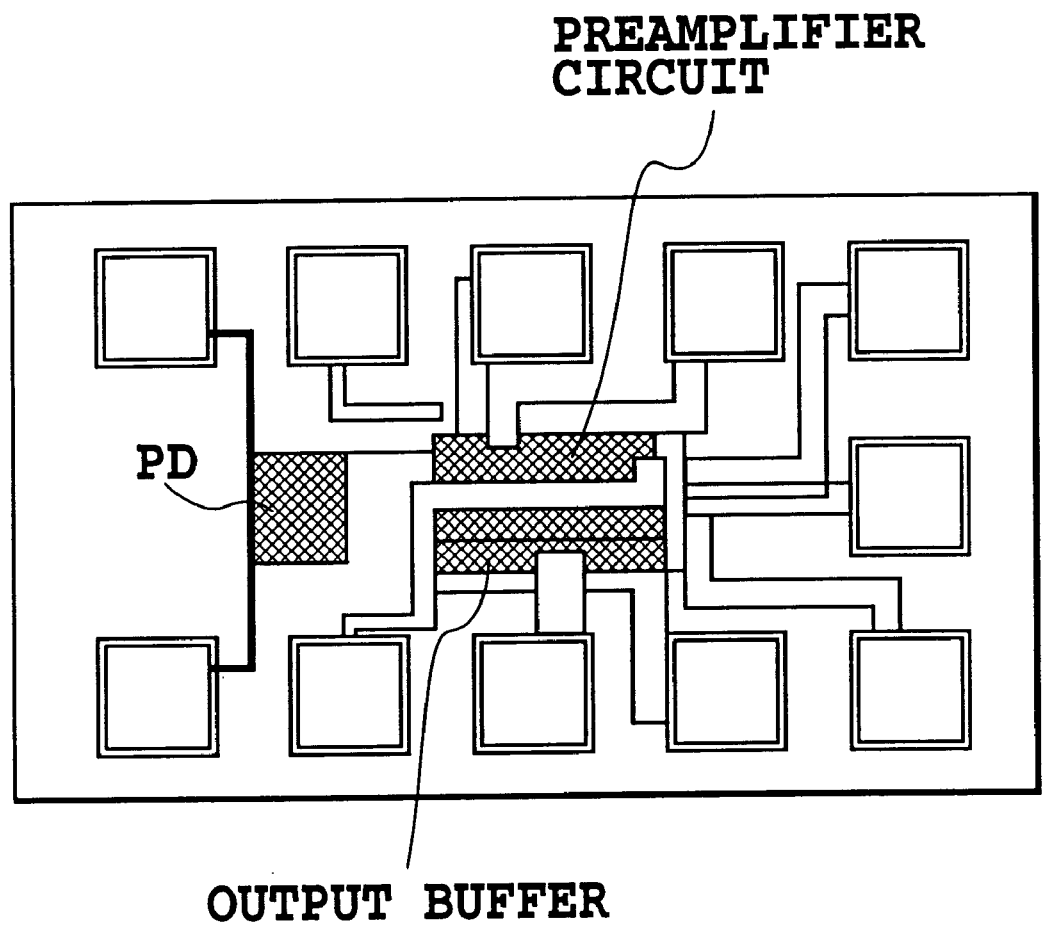
FIG. 14 is a diagram showing a photodetector circuit layout comprising a photodetector of the present invention and a preamplifier formed on a SIMOX substrate.
Figure 19:
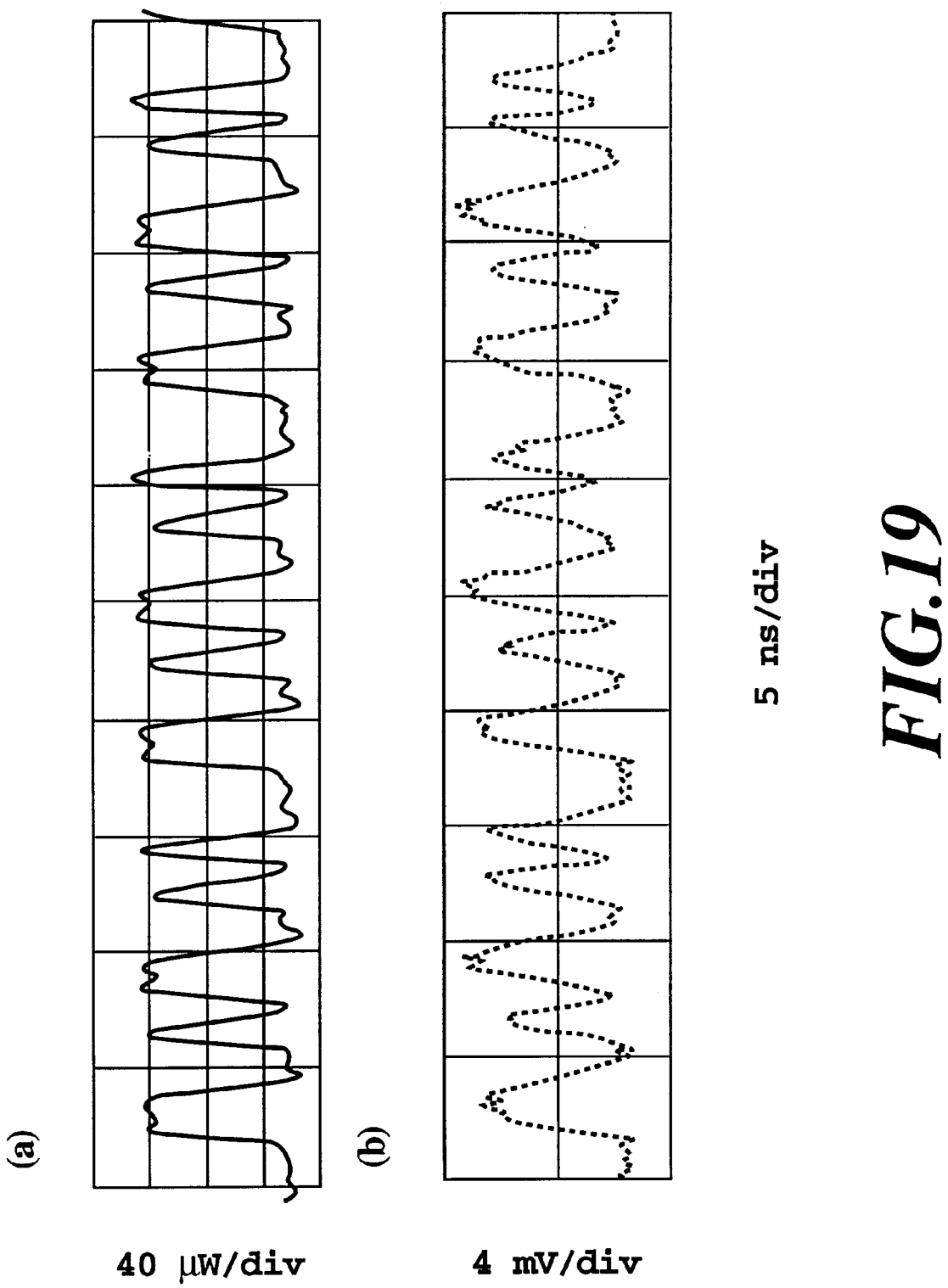
FIG. 19 is a graph illustrating resemblance of an output waveform with respect to an input waveform in a photodetector according to an embodiment of the present invention.

Referring to FIGS. 14 and 19, the p-i-n semiconductor photodetector according to a fifth embodiment of the present invention will be described.

Figure 15:
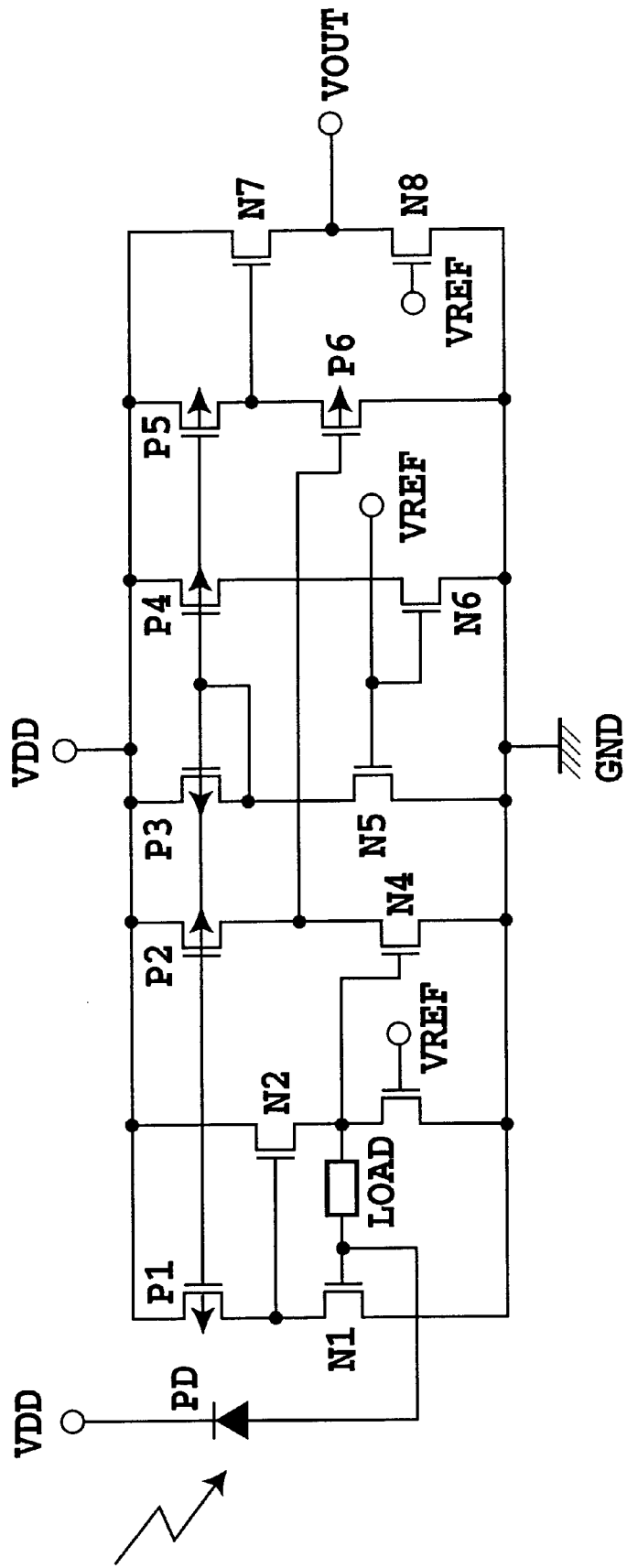
FIG. 15 is a circuit diagram illustrating the preamplifier in the photodetector circuit shown in FIG. 14.
Figure 16:
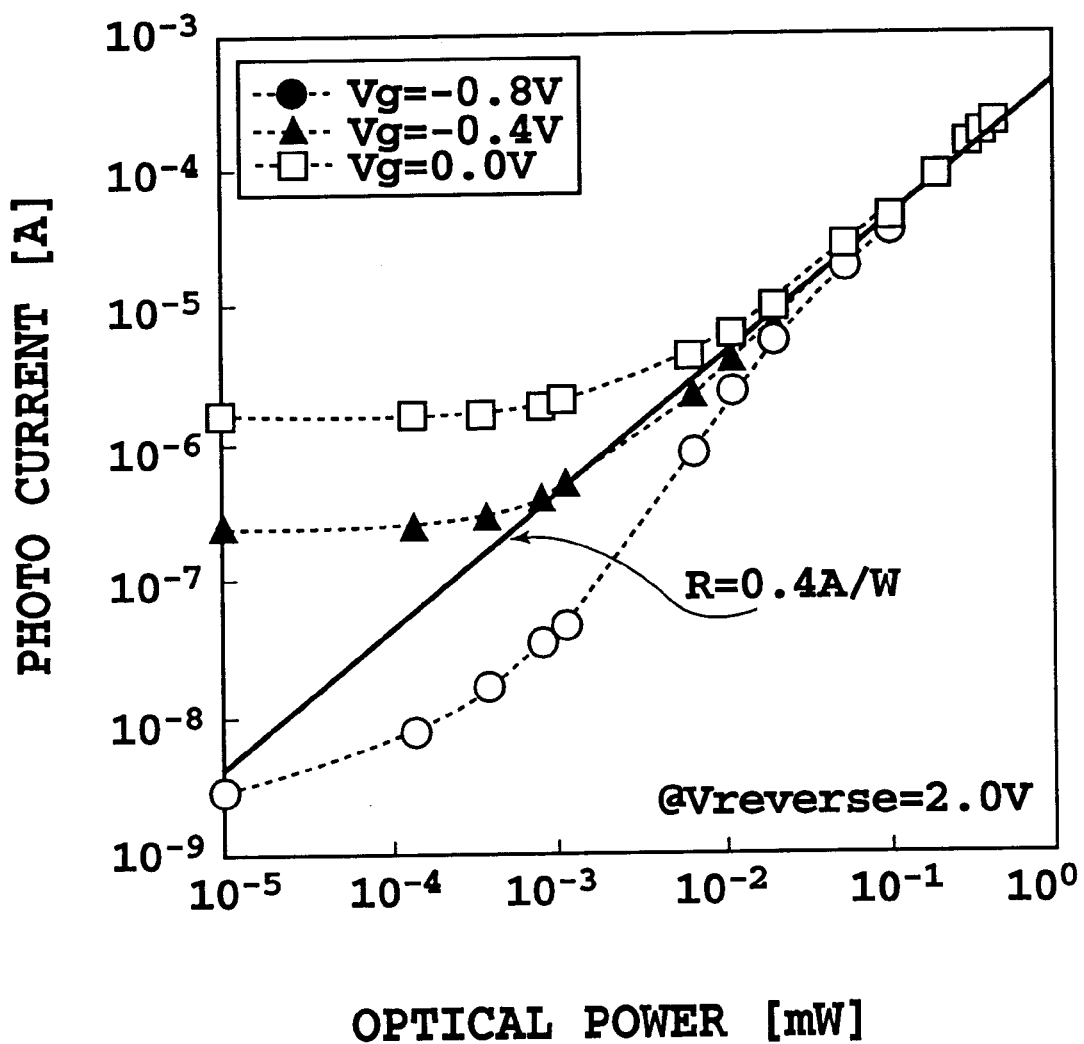
FIG. 16 is a graph illustrating a relationship between an optical input and photocurrent in a photodetector according to an embodiment of the present invention.
Figure 17:
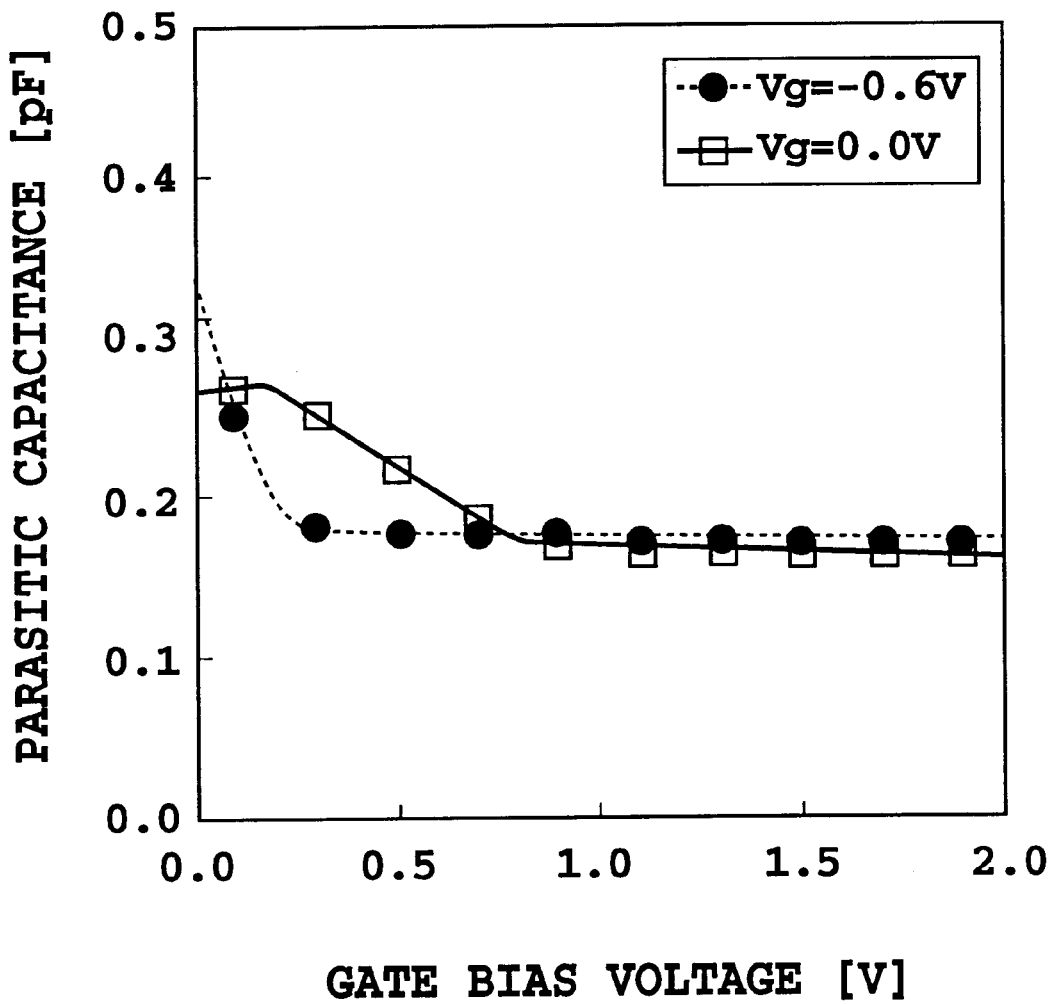
FIG. 17 is a graph illustrating C-V characteristics of a photodetector according to an embodiment of the present invention.
Figure 18:
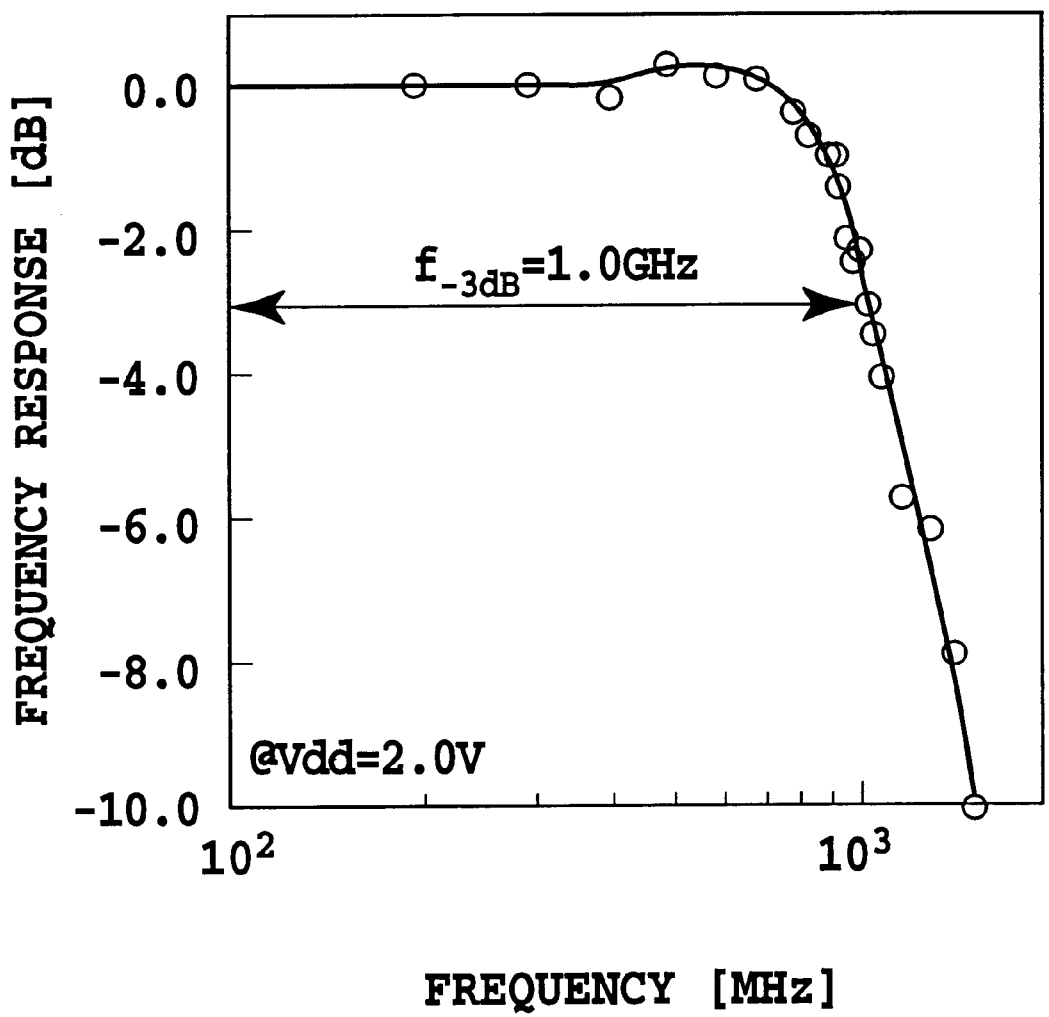
FIG. 18 is a graph illustrating a frequency response of a photodetector according to an embodiment of the present invention.

FIG. 14 is a diagram showing a photodetector circuit layout comprising a photodetector of the present invention and a preamplifier formed on a SIMOX substrate. FIG. 15 is a circuit diagram illustrating the preamplifier in the photodetector circuit shown in FIG. 14. The photodetector had a light receiving area of 60 $\mu m^2$. The thickness of the i-type semiconductor region was 50 nm and the single crystal semiconductor layer 3 was 110 nm thick. When light ($\lambda$=850) was input with supplying a reverse voltage of 2.0V, the responsivity of the photodetector reached 0.4 A/W as illustrated in FIG. 16. Since a high electric field as high as 1 to $2\times10^5$ V/cm existed between the i-type semiconductor region 5 and the p-type semiconductor region 4, avalanche effects occurred in the i-type semiconductor region 5. This increased the responsivity to a level several times as high as that of other photodetector. FIG. 17 is a graph illustrating C-V characteristics of a photodetector according to the present embodiment having a light receiving area of 100 $\mu m^2$. At a supply voltage of –2.0 V, the photodetector had a parasitic capacitance of 0.2 pF. FIG. 18 is a graph illustrating the frequency response of a photodetector according to the present embodiment having a light receiving area of 60 $\mu m^2$. A 3 dB bandwidth was realized at 1 GHz. As illustrated in FIG. 19, when operated at a supply voltage of 2.0 V and a communication rate of 1 GHz, the semiconductor photodetector according to the present embodiment showed an output waveform which accurately followed an input waveform. The average power of input light was 50 $\mu m$ and an output signal was 5 mV.

In the foregoing, only a limited number of embodiments have been described and it will be apparent to one skilled in the art that various modifications and variation can be made to the present invention without departing the spirit of the present invention which will be only limited by the appended claims below.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor photodetector comprising:

an SOI substrate;

a p-i-n photodiode provided on said SOI substrate, said p-i-n photodiode having an i-type semiconductor region;

an insulator film provided on said i-type semiconductor region; and a depleting electrode provided on said insulator film for depleting said i-type semiconductor region.

2. The semiconductor photodetector as claimed in claim 1, wherein said i-type semiconductor region has a 1 $\mu m$ thickness not greater than a width of a depletion layer depending on a concentration of an impurity in said i-type semiconductor region, and said depleting electrode has a voltage fixed to that of ground or a supply voltage from a power source for depleting said i-type semiconductor region.

3. The semiconductor photodetector as claimed in claim 1, wherein said depleting electrode is arranged in a pattern of stripes.

4. The semiconductor photodetector as claimed in claim 1, wherein said depleting electrode is arranged in a pattern of concentric annuli.

5. The semiconductor photodetector as claimed in claim 1, wherein said depleting electrode is arranged in a pattern of antennae.

6. The semiconductor photodetector as claimed in claim 1, further comprising a reflecting film which confines inside of said photodetector a light input from outside into said single crystal semiconductor layer, and said reflecting film is a metal wiring using LSI process.

7. A p-i-n semiconductor photodetector comprising:

an insulator a substrate; film provided on said substrate;

a single crystal semiconductor layer having main surfaces opposite to each other, comprising a p-type semiconductor region, an i-type semiconductor region, and an n-type semiconductor region, arranged in a pattern such that as seen from both main surfaces of said single crystal semiconductor layer, said i-type semiconductor region is arranged between said p-type semiconductor region and said n- type semiconductor region;

biasing electrodes provided on said p-type semiconductor region and said n-type semiconductor region, respectively, in ohmic contact thereto for biasing them;

an insulator film provided on said i-type semiconductor region; and a depleting electrode provided on said insulator film for depleting said i-type semiconductor region;

wherein said depleting electrode has a voltage fixed to that of ground or a supply voltage from a power source for depleting said i-type semiconductor region.

8. A semiconductor photodetector circuit comprising:

a semiconductor photodetector comprising an SOI substrate, a p-i-n photodiode provided on said SOI substrate, said p-i-n photodiode having an i-type semiconductor region;

an insulator film provided on said i-type semiconductor region;

a depleting electrode provided on said insulator film for depleting said i-type semiconductor region; and an amplifier circuit and optionally an integrated circuit, monolithically integrated on said SOI substrate.

* * * * *